United States Patent
Ogihara et al.

(10) Patent No.: US 7,132,473 B2
(45) Date of Patent: Nov. 7, 2006

(54) COMPOSITION FOR FORMING POROUS FILM, POROUS FILM AND METHOD FOR FORMING THE SAME, INTERLEVEL INSULATOR FILM, AND SEMICONDUCTOR DEVICE

(75) Inventors: Tsutomu Ogihara, Niigata-ken (JP);
Fujio Yagihashi, Niigata-ken (JP);
Yoshitaka Hamada, Niigata-ken (JP);
Takeshi Asano, Niigata-ken (JP);
Motoaki Iwabuchi, Niigata-ken (JP);
Hideo Nakagawa, Oumihachiman (JP);
Masaru Sasago, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/706,862

(22) Filed: Nov. 12, 2003

(65) Prior Publication Data

US 2004/0219372 A1   Nov. 4, 2004

(30) Foreign Application Priority Data

Nov. 13, 2002   (JP) ............................. 2002-329124

(51) Int. Cl.
  C08G 77/04   (2006.01)
  C09D 183/04   (2006.01)
(52) U.S. Cl. .................. 524/588; 524/64; 524/186; 521/94; 521/184
(58) Field of Classification Search ................ 524/588, 524/186, 64; 521/64, 94, 184
See application file for complete search history.

(56) References Cited

U.S. PATENT DOCUMENTS

| | | | |
|---|---|---|---|
| 4,634,509 A | 1/1987 | Shimizu et al. | |
| 5,494,859 A | 2/1996 | Kapoor | |
| 5,707,783 A | 1/1998 | Stauffer et al. | |
| 6,037,275 A | 3/2000 | Wu et al. | |
| 6,197,913 B1 | 3/2001 | Zhong | |
| 6,313,045 B1 | 11/2001 | Zhong et al. | |
| 6,359,096 B1 | 3/2002 | Zhong et al. | |
| 6,376,634 B1 | 4/2002 | Nishikawa et al. | |
| 6,391,999 B1 | 5/2002 | Crivello | |
| 6,413,647 B1 | 7/2002 | Hayashi et al. | |
| 6,512,071 B1 | 1/2003 | Hacker et al. | |
| 6,533,855 B1 | 3/2003 | Gaynor et al. | |
| 6,534,025 B1 | 3/2003 | Yano et al. | |
| 6,596,404 B1 | 7/2003 | Albaugh et al. | |
| 6,632,489 B1 | 10/2003 | Watanabe et al. | |
| 6,639,015 B1 | 10/2003 | Nakashima et al. | |
| 6,696,538 B1 | 2/2004 | Ko et al. | |
| 2002/0020327 A1 | 2/2002 | Hayashi et al. | |
| 2002/0098279 A1 | 7/2002 | Lyu et al. | |
| 2002/0155053 A1 | 10/2002 | Nishiyama et al. | |
| 2002/0160207 A1 | 10/2002 | Kohmura et al. | |
| 2003/0064321 A1 | 4/2003 | Malik et al. | |
| 2003/0091838 A1 | 5/2003 | Hayashi et al. | |
| 2003/0104225 A1 | 6/2003 | Shiota et al. | |
| 2003/0157311 A1 | 8/2003 | MacDougall et al. | |

FOREIGN PATENT DOCUMENTS

| | | |
|---|---|---|
| EP | 1 205 438 A1 | 5/2002 |
| EP | 1223192 | 7/2002 |
| EP | 1245642 | 10/2002 |
| EP | 1 123 753 A2 | 8/2003 |
| JP | 63-015355 | 4/1988 |
| JP | 05-125191 | 5/1993 |
| JP | 06-145599 | 5/1994 |
| JP | 09-194298 | 7/1997 |
| JP | 11-246665 | 9/1999 |
| JP | 2000-044875 | 2/2000 |
| JP | 2002-30249 | 7/2000 |
| JP | 2000-309751 | 11/2000 |
| JP | 2000-309753 | 11/2000 |
| JP | 2000-345041 | 12/2000 |
| JP | 2001-002993 | 1/2001 |
| JP | 2001-049178 | 2/2001 |
| JP | 2001-049179 | 2/2001 |
| JP | 2001-055554 | 2/2001 |
| JP | 2001-080915 | 3/2001 |
| JP | 2001-98218 | 4/2001 |
| JP | 2001-115021 | 4/2001 |
| JP | 2001-115028 | 4/2001 |
| JP | 2001-115029 | 4/2001 |
| JP | 2001-130911 | 5/2001 |

(Continued)

OTHER PUBLICATIONS

Burkett et al., "Synthesis Of Hybrid Inorganic-Organic Mesoporous Silica By Co-Condensation Of Siloxane And Organosiloxane Precursors," *J. Chem. Soc. Chem. Commun.*, 1996, 1367-1368.

(Continued)

*Primary Examiner*—Irina S. Zemel
(74) *Attorney, Agent, or Firm*—Alston & Bird LLP

(57) ABSTRACT

Provided are a composition for forming film which can form porous film excelling in dielectric constant, adhesiveness, uniformity of the film, mechanical strength and having low hygroscopicity; porous film and a method for forming the film; and a high-performing and highly reliable semiconductor device comprising the porous film inside. More specifically, provided is a composition for forming porous film, the composition comprising siloxane polymer and one or more quaternary ammonium salts represented by following formula (1) or (2):

$$[(R^1)_4N]^+[R^2X]^- \quad (1)$$

$$H_k[(R^1)_4N]_m^+Y^{y-} \quad (2)$$

wherein X represents $CO_2$, $OSO_3$ or $SO_3$; Y represents $SO_4$, $SO_3$, $CO_3$, $O_2C-CO_2$, $NO_3$ or $NO_2$; and k is 0 or 1, m is 1 or 2 and n is 1 or 2 in proviso that n=1 requires k=0 and m=1, and n=2 requires k=0 and m=2, or k=1 and m=1.

3 Claims, 1 Drawing Sheet

FOREIGN PATENT DOCUMENTS

| | | |
|---|---|---|
| JP | 2001-131479 | 5/2001 |
| JP | 2001-157815 | 6/2001 |
| JP | 2001-164186 | 6/2001 |
| JP | 2001-203197 | 7/2001 |
| JP | 2001-240798 | 9/2001 |
| JP | 2001-354904 | 12/2001 |
| JP | 2002-020688 | 1/2002 |
| JP | 2002-020689 A | 1/2002 |
| JP | 2002-023354 | 1/2002 |
| JP | 2002-030249 A | 1/2002 |
| JP | 2002-038090 A | 2/2002 |
| WO | WO 00/12640 | 3/2000 |
| WO | WO 03/088344 | * 10/2003 |

OTHER PUBLICATIONS

Inagaki et al., "Synthesis Of Highly Ordered Mesoporous Materials From A Layered Polysilicate", *J. Chem. Soc. Chem. Commun.*, 1993, pp. 680-682.

* cited by examiner

COMPOSITION FOR FORMING POROUS FILM, POROUS FILM AND METHOD FOR FORMING THE SAME, INTERLEVEL INSULATOR FILM, AND SEMICONDUCTOR DEVICE

CROSS-REFERENCE TO RELATED APPLICATION

The present application claims priority to Japanese Patent Application No. 2002-329124, filed Nov. 13, 2002, the disclosure of which is incorporated herein by reference in its entirely.

BACKGROUND OF THE INVENTION

1. Field of the Invention

The present invention relates to a composition for film formation, which can be formed into a porous film that excels in dielectric properties, adhesion, film consistency and mechanical strength, and has reduced absorption; a porous film and a method for forming the same; and a semiconductor device, which contains the porous film inside.

2. Description of the Related Art

In the fabrication of semiconductor integrated circuits, as the circuits are packed tighter, an increase in interconnection capacitance, which is a parasitic capacitance between metal interconnections, leads to an increase in interconnection delay time, thereby hindering the enhancement of the performance of semiconductor circuits. The interconnection delay time is called an RC delay, which is in proportion to the product of the electric resistance of the metal interconnections and the static capacitance between the interconnections. Reducing the interconnection delay time requires reducing the resistance of metal interconnections or the interconnection capacitance.

The reduction in resistance of the interconnection metal and the interconnection capacitance can prevent a densely packed semiconductor device from causing an interconnection delay, thereby realizing a smaller and faster semiconductor device with reduced power consumption.

In an attempt to reduce the resistance of metal interconnections, in recent years, metallic copper interconnections have been employed more than conventional aluminum interconnections in the structure of a device. However, use of this structure all has limits in the enhancement of the performance, so the reduction in interconnection capacitance is an urgent necessity for higher performance of semiconductors.

One method for reducing interconnection capacitance is to reduce the relative permittivity (dielectric constant) of an interlevel insulator film disposed between metal interconnections. As such an insulator film with a low relative permittivity, it has been considered to use a porous film instead of a silicon oxide film, which has been used conventionally. A porous film can be said to be the only practical film as a material with a relative permittivity of 2.0 or less, and various methods for forming a porous film have been proposed A first method for forming a porous film is as follows: a precursor solution of a siloxane polymer containing a thermally unstable organic component is synthesized; then the precursor solution is applied on the substrate to form a coating film; and later, a heat treatment is applied to decompose and volatilize the organic component. The result is a number of micro-pores formed in the film.

As a second method for forming a porous film, it is well known to carry out processing as follows: a silica sol solution is applied onto a substrate by coating or using a CVD method so as to form a wet gel; and then the silica sol is subjected to a condensation reaction while restricting volume reduction by controlling the speed of the evaporation of the solvent from the wet gel.

As a third method for forming a porous film, it is well known that a silica micro-particle solution is applied on a substrate to form a coating film, and then the coating film is sintered to form a number of micro-pores between silica micro-particles.

As a fourth method, Japanese Patent Provisional Publication No. 2000-44875 proposes a composition for porous film formation, which is characterized by containing a compound having (A) a component expressed by $(R')_m Si(OR'')_{4-m}$ (R' and R'' are univalent organic radicals, and m is an integer of 0 to 2); (B) a metal chelate compound; and (C) a compound having a polyalkylene oxide structure.

However, these methods have respective major drawbacks as follows.

In the first method for forming a porous film, the synthesis of the precursor solution of the siloxane polymer increases the cost. In addition, the formation of the coating film by coating the precursor solution increases the amount of silanol groups remaining in the coating film, which causes a degassing phenomenon indicating the evaporation of water and the like in the heat treatment process that is conducted later and, which also deteriorates the film quality due to the porous film absorbing humidity.

In the second method for forming a porous film, the speed control of the evaporation of the solvent from the wet gel requires a special type of coating device, which increases the cost. In addition, a significant amount of silanol remains on the surface of the micro-pores, which must be silanized because otherwise hygroscopicity is high and the film quality decreases. The silanization makes the process more complicated. In the case where a wet gel is formed by the CVD process, it is necessary to use a special type of CVD device, which is different from the plasma CVD device generally used in the semiconductor process, thereby also increasing the cost.

In the third method for forming a porous film, the diameter of the micro-pores formed between the silica micro-particles, which is determined by the accumulation structure of the silica micro-particles that are accumulated geometrically, becomes very large. This makes it difficult to set the relative permittivity of the porous film to 2 or below.

In the case of the fourth method, out of the three components (A), (B), and (C), the metal chelate compound of (B) is essential to increase the compatibility of the components (A) and (C), and to make the thickness of the coating film uniform after being hardened. However, it is not preferable because it makes the manufacturing process complicated and increases the cost. Therefore, it is desired to develop a material, which enables a homogeneous solution to be formed without a chelate component and the coating film to be flat after being hardened.

Contrary to the conventional method for forming porous film, it has been found that aluminosilicate, silica and the like are first condensed using a mold of micelle formed by a surfactant and then the surfactant is removed from the produced construction by calcination or solvent extraction, which results in the formation of a porous structure having a mesopore (2–50 nm in diameter)—sized channel structure. For instance, according to Inagaki et al. (J. Chem. Soc. Chem. Commun., p. 680, 1993), polysilicate is reacted water in the presence of surfactant as a mold. Moreover, according to the Japanese Patent Provisional Publication No. 9-194298, the tetraalkoxysilane is reacted in water under an acidic condition in the presence of surfactant as a mold and coated on a substrate to form a silica porous film containing pores having pore diameter of 1 to 2 nm.

However, there is a problem with these methods. In the former, although a powdery porous body is easily made, a porous film cannot be formed on a substrate which is used for producing a semiconductor device. In the latter, although a porous film can be formed, the orientation of pores cannot be controlled so that uniform film in a large area thereof cannot be obtained.

Further, according to Japanese Patent Provisional Publication No. 2001-130911, the silica meso-porous film is formed using a mixture of a surfactant and a product obtained by acid hydrolysis and condensation of silicon alkoxide, where the mixture has been prepared and stabilized at pH value of 3 or less.

However, in this case, because a solute concentration is specified, it is difficult to control the coating film thickness. Then, it is difficult to apply this method to an actual semiconductor manufacturing process. Moreover, when this solution is diluted with water, although the thickness of the coated film can be controlled, the rate of condensation polymerization of the silica component increases, so that the stability of the coating liquid is lost.

On the other hand, the following methods are in the 2001-110529$^{th}$ according to the Japanese Patent Provisional Publication Nos. 2001-115029 and 2001-203197, a coating liquid is obtained by hydrolysis and condensation of a silane compound and provides excellent dielectric properties. Because a modulus of elasticity required in the manufacturing process of an actual semiconductor is 5 GPa or higher, however, the mechanical strength is not sufficient in these inventions.

As mentioned above, when porous film produced by conventional material is used as an insulator film in multi-level interconnects of the semiconductor device, there are problems such that moisture-absorbed porous film increases dielectric constant and lowers the adhesiveness in the lamination of films. Moreover, when the dielectric constant of the porous film used as an insulator film increases, the RC delay in the multi-level interconnects of the semiconductor device is increased. Consequently, the performance of the semiconductor device (high speed and low power consumption) has not been improved. Furthermore, higher cost for forming porous film leads to higher cost for a semiconductor device. Moreover, when conventional porous film is incorporated as an insulator film into the multi-level interconnects of the semiconductor device, there is a problem of the film having insufficient mechanical strength. The low mechanical strength results from the porous film property. Thus, there is a problem that low mechanical strength of the porous film as an insulator film lowers the reliability of a semiconductor device.

SUMMARY OF THE INVENTION

An object of the invention is to provide a composition for forming film which can form a porous film excelling in dielectric constant, adhesiveness, uniformity of the film, mechanical strength and having low hygroscopicity. Moreover, an object of the invention is to provide a high-performing and highly reliable semiconductor device comprising the porous film inside.

The inventors focused intently on the development of a coating liquid for forming the porous film. As a result, they reached the composition for forming porous film having low dielectric constant as well as high mechanical strength which is applicable to the semiconductor production process, and the method for forming the porous film, based on that siloxane polymer is heated with so-called a structure-directing agent. Then, they completed the invention.

For example, according to the description of page 95 of "Creation and application of the molecular coordination material", supervised by Kunihiro Ichimura, published by CMC Publishing Co., Ltd., structure-directing agents generally refer to organic cation which is used in synthesis of zeolite and are known to play an important role in hydrothermal synthesis of high silica zeolite. A quaternary ammonium compound, especially hydroxide, is often preferably used as organic cation substance. Particularly in the field of manufacturing an insulator film having a low dielectric constant to which the invention relates, according to the Japanese Patent Provisional Publication No. 2002-30249, a method for manufacturing a insulator film having low dielectric constant using quaternary ammonium hydroxide or quaternary ammonium halide is known.

Because the quaternary ammonium hydroxide is alkaline, however, the stability of the produced coating solution decreases-markedly, making practical use very difficult. Moreover, when quaternary ammonium halide is used, the residual halogen in the insular film which has been coated and sintered makes lead wires in circuits corroded, thereby obstructing continuity and developing into the possible deterioration of semiconductor devices. Thus, these substances are not suitable.

Therefore, according to the invention, provided is a composition for forming porous film, the composition comprising siloxane polymer and one or more quaternary ammonium salts represented by following formula (1) or (2):

  (1)

  (2)

wherein $R^1$ independently represents a straight chain or branched alkyl or aryl group having 1 to 10 carbons which may have a substituent and $R^1$s may be same or different; $R^2$ represents a hydrogen atom or an straight chain or-branched alkyl or aryl group having 1 to 10 carbons which may have a substituent; X represents $CO_2$, $OSO_3$ or $SO_3$; Y represents $SO_4$, $SO_3$, $CO_3$, $O_2C—CO2$, $NO_3$ or $NO_2$; and k is 0 or 1, m is 1 or 2 and n is 1 or 2 in proviso that n=1 requires k=0 and m=1, and n=2 requires k=0 and m=2, or k=1 and m=1.

The structure-directing agents conventionally known are quaternary ammonium hydroxide and quaternary ammonium halide. The quaternary ammonium hydroxide is a nucleation crystal growth model as indicated in P.P.E,A.D. Moor et al., Chem. Eur. J., 5, 7, 2083 (1998) so that the quaternary ammonium hydrolyzes and condensates silane monomers to form an aggregate from which zeolite crystal grows. Therefore, the quaternary ammonium hydroxide has ability to direct a structure as monomers grow to be crystal.

On the other hand, the structure-directing agent used for this invention has the effect of structure-directing by means of not using monomers but changing the configuration of polymer whose frame has already been formed. Actually, it is supported by the GPC measurements of no increase in molecular weight distribution before and after addition of this structure-directing agent.

Such a quaternary ammonium salt compound is not known to have a property of a structure-directing agent until we discovers. We has found the novel property and completed the invention.

Moreover, quaternary ammonium halide is conventionally known as a substance to form a zeolite structure or honeycomb structure by forming micelle between polymer and a quaternary ammonium salt, in a similar manner to that of the invention. On the other hand, the quaternary ammonium salt used for the invention is easily decomposed by heating for hardening the coated film so that problems such as corrosion of circuit do not occur. This is also different from conventional halide.

According to the invention, a method for forming a porous film comprising a step of applying the composition on a substrate, subsequently a drying step and a heating step for hardening the porous film. Moreover, a porous film obtainable from the composition for forming a porous film is provided. These are applicable to the semiconductor manufacturing process and provide a porous film having an excellent dielectric constant and mechanical properties.

According to the invention, the semiconductor device containing an internal porous film formable by the composition for forming a porous film is provided. More specifically, a porous film is used as an insulator film in the multi-level interconnects in a semiconductor device. Consequently, because the mechanical strength of the semiconductor device is secured and the hygroscopic property of the porous film is decreased, a semiconductor device containing an internal porous film having low dielectric constant is obtained. Because of lower dielectric constant of the insulator film, the parasitic capacitance of the area around the multi-level interconnects is decreased, leading to the high-speed operation and low power consumption of the semiconductor device. Moreover, it is preferable in the semiconductor device of the invention that said porous film is between metal interconnections in a same layer of multi-level interconnects, or is between upper and lower metal interconnection layers. This arrangement can achieve a high-performing and highly reliable semiconductor device.

The use of the composition for forming porous film of the invention can facilitate the formation of porous film having a desirably controlled thickness. This porous film has low dielectric constant and excels in adhesion, film uniformity and mechanical strength. In addition, use of the porous film formable by the composition of the invention as the insulator film of the multi-level interconnects can achieve a high-performing and highly reliable semiconductor device.

DETAILED DESCRIPTION OF THE PREFERRED EMBODIMENTS

Figure 1:
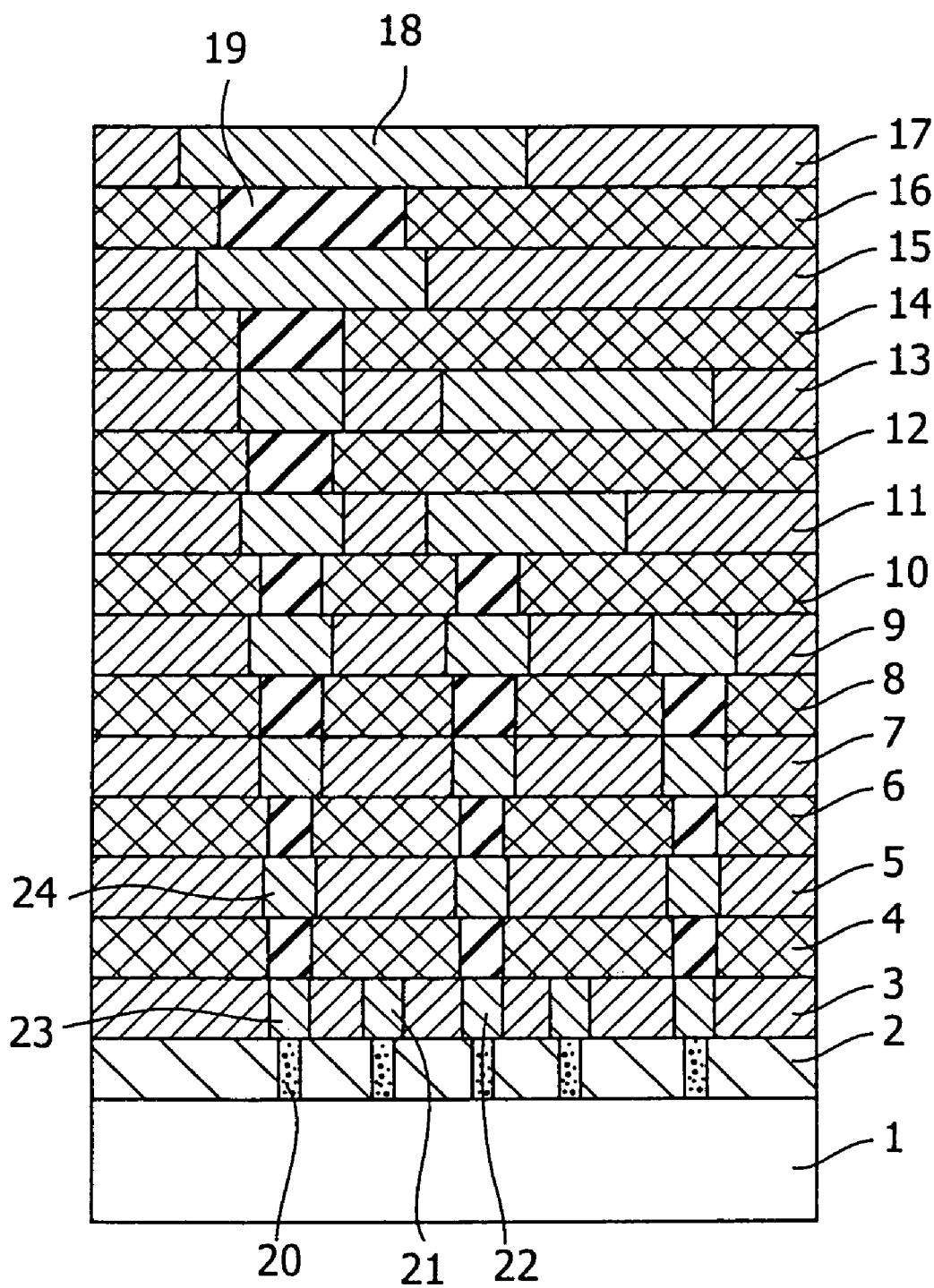
FIG. 1 is a schematic cross-sectional view of a semiconductor device of the invention.

The siloxane polymer used for the invention can be a polymer obtained by a well-known method. For instance, the siloxane polymer may be a polymer obtainalble by the method introduced by C. J, Brinker and G. W. Scherer, "Sol-gel Science," Academic Press (1990); Kunio Ito, "Silicone Handbook," Nikkan Kogyo Shimbun Co. (1990); Sumio Sakka, "Science of the Sol-gel Method," Agne Shofu-sha (1988); or Sumio Sakka, "Application of the Sol-gel Method" Agne Shofu-sha (1997).

Specifically, the siloxane polymer may be produced by hydrolysis and condensation of one or more silane compounds in the presence of acidic or basic catalyst in an organic solvent to which water has been added, wherein the silane compound comprises one or more hydrolysable substituents within the molecule.

The silane compound may include, but is not limited to, tetramethoxysilane, tetraethoxysilane, tetrapropoxysilane, tetrabutoxysilane, methyltrimethoxysilane, methyltriethoxysilane, methyltripropoxysilane, ethyltrimethoxysilane, propyltrimethoxysilane, butyltrimethoxysilane, pentyltrimethoxysilane, hexyltrimethoxysilane, 2-ethylhexyltrimethoxysilane, phenyltrimethoxysilane, dimethyldimethoxysilane, dimethyldiethoxysilane, trimethylmethoxysilane, triethylmethoxysilane, butyldimethylmethoxysilane, hexamethoxydisilane, hexaethoxydisilane, 1,2-bis(trimethoxysilyl)ethane, 1,2-bis(triethoxysilyl) ethane, 1,6-bis(trimethoxysilyl)hexane, 1,6-bis(triethoxysilyl)hexane, 1,4-bis(trimethoxysilyl)benzene, 1,4-bis(triethoxysilyl)benzene, 1,2-bis(dimethoxymethylsilyl)ethane 1,2-bis(diethoxymethylsilyl)ethane, 1,6-bis(dimethoxymethylsilyl) hexane, 1,6-bis(diethoxymethylsilyl)hexane, 1,4-bis(dimethoxymethylsilyl)benzene, 1,4-bis(diethoxymethylsilyl)benzene, 1,2-bis(methoxydimethylsilyl)ethane, 1,2-bis(ethoxydimethylsilyl)ethane, 1,6-bis(methoxydimethylsilyl)hexane, 1,6-bis(ethoxydimethylsilyl)hexane, 1,4-bis(methoxydimethylsilyl)benzene and 1,4-bis(ethoxydimethylsilyl)benzene.

The organic solvent used in the invention may include methanol, ethanol, isopropyl alcohol, butanol, propylene glycol monomethyl ether, propylene glycol monopropyl ether, propylene glycol monopropyl ether acetate, ethyl lactate and cyclohexanone. The solvent other than water may be added in an amount of preferably 0.1 to 500 times, more preferably 1 to 100 times the weight of the silicon compound. The water for the hydrolysis may be added in an amount of preferably 0.5 to 10 times, more preferably 1.0 to 4.0 times the mole number required for complete hydrolysis of the silane compound.

An example of the acid catalyst used at this time may include inorganic acid such as hydrochloric acid, sulfuric acid and nitric acid; sulfonic acid such as methanesulfonic acid, benzenesulfonic acid, p-toluenesulfonic acid and trifluoromethanesulfonic acid; organic acid such as formic acid, acetic acid, propionic acid, oxalic acid, malonic acid, fumaric acid, malenic acid, tartaric acid, citric acid and malic acid; and phosphoric acid. The acid catalyst may be added preferably 0.001 to 10 times, more preferably 0.01 to 1.0 times the mole number of the starting silicon compound.

On the other hand, basic catalyst which can be used in this case may include ammonia; amine such as ethylamine, propylamine, diisopropylamine, triethylamine and triethanolamine; and alkali metal hydroxide or alkaline earth metal hydroxide such as sodium hydroxide, potassium hydroxide, and calcium hydroxide. The basic catalyst may be added in an amount of preferably 0.001 to 10 times, more preferably 0.01 to 1.0 times the mole number of the starting silane compound.

The typical production procedure of a siloxane polymer may be as follows. The abovementioned organic solvent may be mixed with water and the reaction catalyst. The silicon compound in a required amount may be then added thereto and treated at the prescribed temperature for a given time to produce target polymer. Physical properties of the obtained polymer can be changed depending on reaction temperature, an amount of water to be-added, a type of organic solvent used for the reaction, and concentration and type of the starting silicon compound.

The reaction temperature may be typically from 0° C. to the boiling point of alcohol which is produced as the result of the hydrolysis and condensation. It may be preferably from-room temperature to 100° C. The reaction time may not be particularly limited. It may be typically)between 10 minutes and 30 hours, more preferably 30 minutes to 10 hours.

The preferably weight-average molecular weight of the siloxane polymer may be 10,000 to 1,000,000 using polyethylene as standard with Gel Permeation Chromatograph (GPC). It may be because the property of porous film useful also as an insulation film a semiconductor device is realized.

To the obtained solution of siloxane polymer is added quaternary ammonium salt represented by formula (1) or (2) and treated. Accordingly, the polymer frame can be transformed into a structure similar to the zeolite structure.

The $R^1$ represented by formulas (1) and (2) may include, but not limited to, methyl, ethyl, n-propyl, iso-propyl, n-butyl isobutyl, sec-butyl, n-pentyl, 2-methylbutyl, 3-methylbuty, 2,2-dimethylpropyl, n-hexyl, 2-methylpentyl, 3-methylpentyl, 4-methylpenty, 2,2-dimethylbutyl, 3,3-dimethylbutyl, n-heptyl, 2-methylhexyl, 3-methylhexyl, 4-methylhexyl, 5-methylhexyl, 2,2-dimethylpentyl, 3,3-dimethylpentyl, 4,4-dimethylpentyl, 3-ethylpentyl, 4-ethylpentyl, n-octyl, 2-methylheptyl, 3-methylheptyl, 4-methylheptyl, 5-methylheptyl, 6-methylheptyl, 2,2-dimethylhexyl, 3,3-dimethylhexyl, 4,4-dimethylhexyl, 5,5-dimethylhexyl, 3-ethylhexyl, 4-ethylhexyl, 5-ethylhexyl, n-nonyl, 2-methyloctyl, 3-methyloctyl, 4-methyloctyl, 5-methyloctyl, 6-methyloctyl, 7-methyloctyl, 2,2-dimethylheptyl, 3,3-dimethylheptyl, 4,4-dimethylheptyl, 5,5-dimethylheptyl, 6,6-dimethylheptyl, 3-ethylheptyl, 4-ethylheptyl, 5-ethylheptyl, 6-ethylheptyl, n-decyl, 2-methylnonyl, 3-methylnonyl, 4-methylnonyl, 5-methylnonyl, 6-methylnonyl, 7-methylnonyl, 2,2-dimethyloctyl, 3,3-dimethyloctyl, 4,4-dimethyloctyl, 5,5-dimethyloctyl, 6,6-dimethyloctyl, 7,7-dimethyloctyl, 3-ethyloctyl, 4-ethyloctyl, 5-ethyloctyl, 6-ethyloctyl, 7-ethyloctyl, phenyl, o-tolyl, m-tolyl and p-tolyl.

The $R^2$ represented by formula (1) may include a hydrogen atom, methyl, ethyl, n-propyl, isopropyl, n-butyl, isobutyl, sec-butyl, n-pentyl, 2-methylbutyl, 3-methylbutyl, 2,2-dimethylpropyl, n-hexyl, 2-methylpentyl, 3-methylpentyl, 4-methylpentyl, 2,2-dimethylbutyl, 3,3-dimethylbutyl, n-heptyl, 2-methylhexyl, 3-methylhexyl, 4-methylhexyl, 5-methylhexyl, 2,2-dimethylpentyl, 3,3-dimethylpentyl, 4,4-dimethylpentyl, 3-ethylpentyl, 4-ethylpentyl, n-octyl, 2-methylheptyl, 3-methylheptyl, 4-methylheptyl, 5-methylheptyl, 6-methylheptyl, 2,2-dimethylhexyl, 3,3-dimethylhexyl, 4,4-dimethylhexyl, 5,5-dimethylhexyl, 3-ethylhexyl, 4-ethylhexyl, 5-ethylhexyl, n-nonyl, 2-methyloctyl, 3-methyloctyl, 4-methyloctyl, 5-methyloctyl, 6-methyloctyl, 7-methyloctyl, 2,2-dimethylheptyl, 3,3-dimethylheptyl, 4,4-dimethylheptyl, 5,5-dimethylheptyl, 6,6-dimethylheptyl, 3-ethylheptyl, 4-ethylheptyl, 5-ethylheptyl, 6-ethylheptyl, n-decyl, 2-methylnonyl, 3-methylnonyl, 4-methylnonyl, 5-methylnonyl, 6-methylnonyl, 7-methylnonyl, 2,2-dimethyloctyl, 3,3-dimethyloctyl, 4,4-dimethyloctyl, 5,5-dimethyloctyl, 6,6-dimethyloctyl, 7,7-dimethyloctyl, 3-ethyloctyl, 4-ethyloctyl, 5-ethyloctyl, 6-ethyloctyl, 7-ethyloctyl, phenyl, o-tolyl, m-tolyl and p-tolyl. In addition, one or more hydrogen atoms of the above example may be substituted by hydroxy, methoxy, ethoxy, n-propoxy, isopropoxy, phenoxy, methylthio, ethylthio, amino, methylamino dimethylamino, carboxy, methoxycarbonyl, ethoxycarbonyl, formyloxy, acetoxy, benzoyloxy, formyl, acetyl or propionyl.

The X in formulation (1) represents $CO_2$, $OSO_3$ or $SO_3$.

The quaternary ammonium salt represented by formula (1) may include tetramethylammonium formate, tetramethylammonium acetate, tetramethylammonium propionate, tetramethylammonium butyrate, tetramethylammonium isobutyrate, tetramethylammonium valerate, tetramethylammonium pivalate, tetramethylammonium haxanoate, tetramethylammonium octanoate, tetramethylammonium decanoate, tetramethylammonium lactate, trimethylethylammonium formate, trimethylethylammonium acetate, trimethylethylammonium propionate, trimethylethylammonium butyrate, trimethylethylammonium isbutyrate, trimethylethylammonium valerate, trimethylethylammonium pivalate, trimethylethylammonium hexanoate, trimethylethylammonium octanoate, trimethylethylammonium decanoate, trimethylethylammonium lactate, trimethylpropylammonium formate, trimethylpropylammonium acetate, trimethylpropylammonium propionate, trimethylpropylammonium butyrate, trimethylpropylammonium isobutyrate, trimethylpropylammonium valerate, trimethylpropylammonium pivalate, trimethylpropylammonium hexanoate, trimethylpropylammonium octanoate, trimethylpropylammonium decanoate, trimethylpropylammonium lactate, trimethylbutylammonium formate, trimethylbutylammonium acetate, trimethylbutylammonium propionate, trimethylbutylammonium butyrate, trimethylbutylammonium isobutyrate, trimethylbutylammonium valerate, trimethylbutylammonium pivalate, trimethylbutylammonium hexanoate, trimethylbutylammonium octanoate, trimethylbutylammonium decanoate, trimethylbutylammonium lactate, trimethylpentylammonium formate, trimethylpentylammonium acetate, trimethylpentylammonium propionate, trimethylpentylammonium butyrate, trimethylpentylammonium isobutyrate, trimethylpentylammonium valerate, trimethylpentylammonium pivalate, trimethylpentylammonium hexanoate, trimethylpentylammonium octanoate, trimethylpentylammonium decanoate, trimethylpentylammonium lactate, trimethylhexylammonium formate, trimethylhexylammonium acetate, trimethylhexylammonium propionate, trimethylhexylammonium butyrate, trimethylhexylammonium isobutyrate, trimethylhexylammonium valerate, trimethylhexylammonium pivalate, trimethylhexylammonium hexanoate, trimethylhexylammonium octanoate, trimethylhexylammonium decanoate, trimethylhexylammonium lactate, trimethylheptylammonium formate, trimethylheptylammonium acetate, trimethylheptylammonium propionate, trimethylheptylammonium butyrate, trimethylheptylammonium isobutyrate, trimethylheptylammonium valerate, trimethylheptylammonium pivalate, trimethylheptylammonium hexanoate, trimethylheptylammonium octanoate, trimethylheptylammonium decanoate, trimethylheptylammonium lactate, trimethyloctylammonium formate, trimethyloctylammonium acetate, trimethyloctylammonium propionate, trimethyloctylammonium butyrate, trimethyloctylammonium isobutyrate, trimethyloctylammonium valerate, trimethyloctylammonium pivalate, trimethyloctylammonium hexanoate, trimethyloctylammonium octanoate, triimethyloctylammonium decanoate, trimethyloctylammonium lactate, trimethylnonylammonium foramte, ttimethylnonylammonium acetate, trimethylnonylammonium propionate, trimethylnonylammonium butyrate, trimethylnonylammonium isobutyrate, trimethylnonylammonium valerate, trimethylnonylammonium pivalate, trimethylnonylammonium haxanoate, trimethylnonylammonium octanoate, trimethylnonylammonium decanoate, trimethylnonylammonium lactate, trimethyldecylammonium formate, trimethyldecylammonium acetate, trimethyldecylammonium propionate, trimethyldecylammonium butyrate, trimethyldecylammonium isobutyrate, trimethyldecylammonium valerate, trimethyldecylammonium pivalate, trimethyldecylammonium hexanoate, trimethyldecylammonium octanoate, trimethyldecylammonium decanoate, trimethyldecylammonium lactate, methyltriethylammonium formate, methyltriethylammonium acetate, methyltriethylammonium propionate, methyltriethylammonium butyrate, methyltriethylammonium isobutyrate, methyltriethylammonium valerate, methyltriethylammonium pivalate, methyltriethylammonium hexanoate, methyltriethylammonium octanoate, methyltriethylammonium decanoate, methyltriethylammonium lactate, methyltripropylammonium formate, methyltripropylammonium acetate, methyltripropylammonium propionate, methyltripropylammonium butyrate, methyltripropylammonium isobutyrate, methyltripropylammonium valerate, tripropylammonium pivalate, methyltripropylammonium hexanoate, methyltripropylammonium octanoate, methyltripropylammonium decanoate, methyltripropylammonium lactate, methyltributylammonium formate, methyltributylammonium acetate, methyltributylammonium propionate, methyltributylammonium butyrate, methyltributylammonium isobutyrate, methyltributylammonium valerate, methyltributylammonium pivalate, methyltributylammonium hexanoate, methyltributylammonium octanoate, methyltributylammonium decanoate, methyltributylammonium lactate, methyltripentylammonium formate, methyltripentylammonium acetate, methyltripentylammonium propionate, methyltripentylammonium butyrate, methyltripentylammonium isobutyrate, methyltripentylammonium valerate, methyltripentylammonium pivalate, methyltripentylammonium hexanoate, methyltripentylammonium octanoate, methyltripentylammonium decanoate, methyltripentylammonium lactate, methyltrihexyl ammonium formate, methyltrihexylammonium acetate, methyltrihexylammonium propionate, methyltrihexylammonium butyrate, methyltrihexylammonium isobutyrate, methyltrihexylammonium valerate, methyltrihexylammonium pivalate, methyltrihexylammonium hexanoate, methyltrihexylammonium octanoate, methyltrihexylammonium decanoate, methyltrihexylammonium lactate, methyltriheptylammonium formate, methyltriheptylammonium acetate, methyltriheptylammonium proionate, methyltriheptylammonium butyrate, methyltriheptylammonium isobutyrate, methyltriheptylammonium valerate, methyltriheptylammonium pivalate, methyltriheptylammonium hexanoate, methyltriheptylammonium octanoate, methyltriheptylammonium decanoate, methyltriheptylammonium lactate, methyltrioctylammonium foramte, methyltrioctylammonium acetate, methyltrioctylammonium propionate, methyltrioctylammonium butyrate, methyltrioctylammonium isobutyrate, methyltrioctylammonium valerate, methyltrioctylammonium pivalate, methyltrioctylammonium hexanoate, methyltrioctylammonium octanoate, methyltrioctylammonium decanoate, methyltrioctylammonium lactate, methyltrinonylammonium formate, methyltrinonylammonium acetate, methyltrinonylammonium propionate, methyltrinonylammonium butyrate, methyltrinonylammonium isobutyrate, methyltrinonylammonium valerate, methyltrinonylammonium pivalate, methyltrinonylammonium haxanoate, methyltrinonylammonium octanoate, methyltrinonylammonium decanoate, methyltrinonylammonium lactate, methyltridecylammonium formate, methyltridecylammonium acetate, methyltridecylammonium propionate, methyltridecylammonium butyrate, methyltridecylammonium isobutyrate, methyltridecylammonium valerate, methyltridecylammonium pivalate, methyltridecylammonium hexanoate, methyltridecylammonium octanoate, methyltridecylammonium decanoate, methyltridecylammonium lactate, tetraethylammonium formate, tetraethylammonium acetate, tetraethylammonium propionate, tetraethylammonium butyrate, tetraethylammonium isobutyrate, tetraethylammonium valerate, tetraethylammonium pivalate, tetraethylammonium hexanoate, tetraethylammonium octanoate, tetraethylammonium decanoate, tetraethylammonium lactate, tetrapropylammonium formate, tetrapropylammonium acetate, tetrapropylammonium propionate, tetrapropylammonium butyrate, tetrapropylammonium isobutyrate, tetrapropylammonium valerate, tetrapropylammonium pivalate, tetrapropylammonium hexanoate, tetrapropylammonium octanoate, tetrapropylammonium decanoate, tetrapropylammonium lactate, tetrabutylammonium formate, tetrabutylammonium acetate, tetrabutylammonium propionate, tetrabutylammonium butyrate, tetrabutylammonium isobutyrate, tetrabutylammonium valerate, tetrabutylammonium pivalate, tetrabutylammonium hexanoate, tetrabutylammonium octanoate, tetrabutylammonium decanoate, tetrabutylammonium lactate, tetramethylammonium methyl sulfate, tetraethylammonium, methyl sulfate, tetrapropylammonium methyl sulfate, tetrabutylammonium methyl sulfate, tetramethylammonium methanesulfate, tetraethylammonium methanesulfate, tetrapropylammonium methasulfate, tetrabutylammonium methasulfate, tetramethylammonium ethanesulfate, tetraethylammonium ethanesulfate, tetrapropylammonium ethanesulfate, tetrabutylammonium ethanesulfate, tetramethylammonium benzenesulfate, tetraethylammonium benzenesulfate, tetrapropylammonium benzenesulfate, tetrabutylammonium benzenesulfate, tetramethylammonium toluenesulfate, tetraethylammonium toluenesulfate, tetrapropylammonium toluenesulfate and tetrabutylammonium toluenesulfate.

Moreover, the substance shown by general formula (2) may be quaternary ammonium sulfate, quaternary ammonium hydrogensulfate, quaternary ammonium sulfite, quaternary ammonium bisulfite, quaternary ammonium carbonate, quaternary ammonium hydrogencarbonate, quaternary ammonium oxalate, quaternary ammonium hydrogenoxalate, quaternary ammonium nitrate or quaternary ammonium nitrite which comprises a substituent represented by the abovementioned $R^1$.

The quaternary ammonium salt represented by general formula (2) may include bistetramethylammonium sulfate, bistetraethylammonium sulfate, bistetrapropylammonium sulfate, bistetrabutylammonium sulfate, tetramethylammonium hydrogensulfate, tetraethylammonium hydrogensulfate, tetrapropylammonium hydrogensulfate, tetrabutylammonium hydrogensulfate, bistetramethylammonium sulfite, bistetraethylammonium sulfite, bistetrapropylammonium sulfite, bistetrabutylammonium sulfite, tetramethylammonium hydrogensulfite, tetraethylammonium hydrogensulfite, tetrapropylammonium hydrogensulfite, tetrabutylammonium hydrogensulfite, bistetramethylammonium carbonate, bistetraethylammonium carbonate, bistetrapropylammonium carbonate, bistetrabutylanmmonium carbonate, tetramethylammonium hydrogencarbonate, tetraethylammonium hydrogencarbonate, tetrapropylammonium hydrogencarbonate, tetrabutylammonium hydrogencarbonate, bistetramethylammonium oxalate, bistetraethylammonium oxalate, bistetrapropylammonium oxalate, bistetrabutylammonium oxalate, tetramethylammonium hydrogenoxalate, tetraethylammonium hydrogenoxalate, tetrapropylammonium hydrogenoxalate, tetrabutylammonium hydrogenoxalate, tetramethylammonium nitrate, tetraethylammonium nitrate, tetrapropylammonium nitrate and tetrabutylammonium nitrate.

The quaternary ammonium salt in this case may be added in an amount of 0.001 to 10 parts by weight, more preferably 0.005 to 5 parts by weight, still more preferably 0.01 to 1 part by weight per 1 part by weight of the siloxane polymer. After the addition, stirring between 10 minutes and 10 hours at 0 to 100° C. under 10 Pa to 5 MPa can provide a target siloxane polymer whose frame structure is changed. In addition, the solvent for having dissolved the siloxane polymer can be replaced by the solvent used for the coating liquid at this stage.

The solvent to be used for the coating liquid may include aliphatic hydrocarbon such as n-pentane, isopentane, n-hexane, isohexane, n-heptane, 2,2,4-trimethylpentane, n-octane, isooctane, cyclohexane and methylcyclohexane; aromatic hydrocarbon such as benzene, toluene, xylene, ethylbenzene, trimethylbenzene, methylethylbenzene, n-propylbenzene, isopropylbenzene, diethylbenzene, isobutylbenzene, triethylbenzene, diisopropylbenzene and n-amyl naphthalene; ketone such as acetone, methyl ethyl ketone, methyl n-propyl ketone, methyl n-butyl ketone, methyl isobutyl ketone, cyclohexanone, 2-hexanone, methylcyclohexanone, 2,4-pentanedione, acetonyl acetone, diacetone alcohol, acetophenone and fenthion; ether such as ethyl ether, isopropyl ether, n-butyl ether, n-hexyl ether, 2-ethylhexyl ether, dioxolane, 4-methyldioxolane, dioxane, dimethyl dioxane, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol dimethyl ether, diethylene glycol monoethyl ether, diethylene glycol dimethyl ether, diethylene glycol monoethyl ether, diethylene glycol diethyl ether, diethylene glycol monopropyl ether, diethylene glycol dipropyl ether, diethylene glycol monobutyl ether, diethylene glycol dibutyl ether, tetrahydrofuran, 2-methyltetrahydrofuran, propylene glycol monomethyl ether, propylene glycol dimethyl ether, propylene glycol monoethyl ether, propylene glycol diethyl ether, propylene glycol monopropyl ether, propylene glycol dipropyl ether, propylene glycol monobutyl ether, dipropylene glycol dimethyl ether, dipropylene glycol diethyl ether, dipropylene glycol dipropyl ether and dipropylene glycol dibutyl ether; ester such as diethyl carbonate, ethyl acetate, γ-butyrolactone, γ-valerolactone, n-propyl acetate, isopropyl acetate, n-butyl acetate, isobutyl acetate, sec-butyl acetate, n-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, dipropylene glycol monomethyl ether acetate, dipropylene glycol monoethyl ether acetate, dipropylene glycol mono-n-butyl ether acetate, glycol diacetate, methoxy triglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate and diethyl phthalate; nitrogen-containing solvent such as N-methylformamide, N,N-dimethylformamide, acetamide, N-methylacetamide, N,N-dimethylacetamide, N-methylpropionamide and N-methylpyrrolidone; and sulfur-containing solvent such as dimethyl sulfide, diethyl sulfide, thiophene, tetrahydrothiophene, dimethylsulfoxide, sulfolane and 1,3-propanesultone. It may be used singly or in an admixture of two or more.

Film having a desirable thickness can be obtained preferably by spin-coating with controlled concentration of the solute at an appropriate speed of rotation. The actual thickness of the film may be, but not limited to, typically about 0.2 to 1 µm. However, membranes of different thicknesses can be made. For example, film having a large thickness can be made by repeating the coating. The solvent to be used for diluting the coating liquid may can include same solvent as the replacement solvent for the coating liquid. It can be used singly or in an admixture of two or more.

Although the level of the dilution may depend on the viscosity or the desired film-thickness, the typical content of the solvent or solvents may be 50 to 99% by weight, more preferably 75 to 95% by weight.

The obtained film is heated. This is a heating process (usually called a 'prebake' in a semiconductor process) for drying the coated film. The film may be heated preferably at 50 to 150° C. for several minutes so as to remove the solvent. After the heating step for drying, another heating step for curing the coated film is provided. In the heating step for curing, the coating film may be heated preferably at 150 to 500° C., more preferably 180 to 450° C. The heating time may be preferably 1 to 300 minutes, more preferably 1 to 100 minutes. The heating step for drying and the heating step for curing may be carried out in one heating process or in two heating processes. The obtained film has high mechanical strength in the entire film and may have typically 0.7 to 5 GPa of hardness and 5 to 40 GPa of modulus of elasticity according to the measurement by the nanoindentation. On the other hand, according to the measurement of usual porous material having pores produced thermally by removing the thermally decomposable polymers which have been contained in the silicone resin, the hardness is 0.05 to 2 Gpa and the modulus of elasticity is about 1.0 to 4.0 GPa. Thus, the mechanical strength of the film of the invention is extremely high.

The porous film of the present invention is particularly preferable as the interlevel insulator film of the interconnections in a semiconductor integrated circuit. The semiconductor device is required to reduce interconnection capacitance in order to prevent interconnection delay when highly integrated. Various means have been developed to achieve this, and one of them is to reduce the relative permittivity (dielectric constant) of the interlevel insulator film disposed between metal interconnections. When an interlevel insulator film is prepared by using the composition for forming a porous film of the present invention, the semiconductor device can be downsized and faster and consume less power.

However, conventionally, there is a problem that when a porous film is prepared by introducing pores in the film so as to lower the dielectric constant, the mechanical strength of the film decreases as the density of the material composing the film decreases. The decrease in mechanical strength not only affects the strength of the semiconductor device itself but also causes exfoliation due to insufficient strength in a chemical mechanical polishing process, which is generally used in the fabrication process. Particularly, when used as the interlevel insulator film of a semiconductor, the porous film of the invention having high mechanical strength despite the porosity prevents such exfoliation. Consequently, a highly reliable semiconductor having high speed performance in a small size can be provided.

The embodiments of the semiconductor device of the present invention will be described below. FIG. 1 shows a schematic cross-sectional view of an example of the semiconductor device of the present invention.

In FIG. 1, the substrate 1 is an Si semiconductor substrate such as an Si substrate or an SOI (Si-on-insulator) substrate; however, it can be a compound semiconductor substrate such as SiGe or GaAs. The interlevel insulator films include the interlevel insulator film 2 of the contact layer; the interlevel insulator films 3, 5, 7, 9, 11, 13, 15, and 17 of the interconnection layers; and the interlevel insulator films 4, 6, 8, 10, 12, 14, and 16 of the via layers. The interconnection layers corresponding to the lowermost interlevel insulator film 3 through the uppermost insulator film 17 are abbreviated as M1, M2, M3, M4, M5, M6, M7, and M8, respectively. The via layers corresponding to the lowermost interlevel insulator film 4 through the uppermost insulator film 16 are abbreviated as V1, V2, V3, V4, V5, V6, and V7, respectively. Although some of the metal interconnections are referred to with the numbers 18 and 21 to 24, the other regions with the same pattern not labeled with numbers indicate metal interconnections. The via plug 19 is made from a metal. In the case of copper interconnection, copper is generally used. The regions having the same pattern as the via plug 19 represent via plugs although they are not labeled with numbers in the drawing. The contact plug 20 is connected to the gate of the transistor (not illustrated) formed on the top surface of the substrate 1 or to the substrate. Thus, the interconnection layers and the via layers are alternately stacked, and multilayer interconnections generally indicate M1 and regions higher than M1. In general, M1 to M3 are called local interconnections, M4 and M5 are called intermediate interconnections or semi-global interconnections, and M6 to M8 are called global interconnections.

In the semiconductor device of the present invention, the porous film of the present invention is used as one or more of the interlevel insulator films 3, 5, 7, 9, 11, 13, 15, and 17 of the interconnection layers or the insulator films 4, 6, 8, 10, 12, 14, and 16 of the via layers.

For example, when the porous film of the present invention is used for the interlevel insulator film 3 of the interconnection layer (M1), the interconnection capacitance between the metal interconnection 21 and the metal interconnection 22 can be greatly reduced. When the porous film of the present invention is used for the interlevel insulator film 4 of the via layer (V1), the interconnection capacitance between the metal interconnection 23 and the metal interconnection 24 can be greatly reduced. Using the porous film with a low relative permittivity of the present invention as an interconnection layer can greatly reduce the metal interconnection capacitance in the same layer. On the other hand, using the porous film with a low relative permittivity of the present invention as a via layer can greatly reduce the capacitance between the upper and lower metal interconnection layers.

Therefore, using the porous film of the present invention for all of the interconnection layers and the via layers can greatly reduce the parasitic capacitance of the interconnections. The porous film of the present invention enables a semiconductor device to have higher mechanical strength by its high mechanical strength, thereby greatly improving the yield of the fabrication and the reliability of the semiconductor device.

The invention will be described specifically through the following examples, but is not limited to them.

SYNTHETIC EXAMPLE 1

(Synthesis of Siloxane Polymer with Acidic Catalyst)

An aqueous 0.05 wt % nitric acid solution of 60 g was added to the solution mixture of tetraethoxysilane (80 g), methyltrimethoxysilane (50 g) and ethanol (460 g), and stirred for four hours at 25° C. The ethanolic solution of the silicone polymer was obtained.

SYNTHETIC EXAMPLE 2

(Synthesis of Siloxane Polymer with Basic Catalyst)

A solution of tetraethoxysilane (60 g) and methyltrimethoxysilane (30 g) was added to the mixture of the solution of an aqueous 40 wt % methylamine solution (log), ultra pure water (640 g) and ethanol (1200 g), and stirred for four hours at 75° C. The ethanolic solution of the silicone polymer was obtained.

SYNTHETIC EXAMPLE 3

(Synthesis of Siloxane Polymer with Basic Catalyst)

A solution of tetramethoxysilane (40 g) and methyltrimethoxysilane (30 g) was added to the mixture of an aqueous 28wt % ammonia solution (10 g), ultra pure water (640 g) and ethanol (1200 g), and stirred for four hours at 75° C. The ethanolic solution of silicone polymer was obtained.

EXAMPLE 1

An aqueous 5wt % tetramethylammonium caproate solution (90 g) and propylene glycol monopropyl ether (700 g) were added at 25° C. to the siloxane polymer solution (650 g) obtained in Synthetic Example 1. After stirring for one hour, the reaction mixture was concentrated under reduced pressure at 40° C. so that the coating liquid (700 g) was obtained. Then, it was applied on an eight-inch wafer with a spin coater for one minute at 1,500 rpm. The film thickness, when heated for two minutes at 120° C. using a hot plate, was 8,000 A. After it was further heated at 250° C. for three minutes, it was heated at 450° C. for one hour in a nitrogen atmosphere in a clean oven. The thickness was 7,200 A. The dielectric constant of the obtained film was 2.2 and the modulus of elasticity thereof was 6.5 Gpa. The coating liquid obtained was left stand at 23° C. for 30 days. Afterwards, the film was obtained in the same manner as the above. Then, the values of the properties were obtained.

Method for Measuring Properties

<Dielectric Constant>

It was measured by CV technique using an automatic mercury probe with an automatic mercury CV measurement device 495-CV system (made by SSM Japan KK).

<Modulus of Elasticity>

It was measured with a Nano indenter (made by the Nano Instruments Innovation Center).

EXAMPLE 2

An aqueous 5 wt % trimethyloctylammonium acetate solution (16 g)and propylene glycol monopropyl ether (300 g) were added at 25° C. to the solution (1 kg) obtained in Synthetic Example 2. After it was stirred for one hour, the reaction mixture was concentrated under reduced pressure at 40° C. and the coating liquid (300 g) was obtained. The film was then formed in the same manner as that in Example 1. The dielectric constant of the coated film formed in the same manner was 2.1, and the modulus of elasticity was 5.5 GPa. The properties were measured after 30 days in same manner as in Example 1, the identical values were obtained.

EXAMPLE 3

An aqueous 5 wt % tetrapropylammonium acetate solution (16 g) and propylene glycol monopropyl ether (200 g) were added at 25° C. to the solution (1 kg) obtained in Synthetic Example 3. After it was stirred for one hour, the reaction mixture was concentrated under reduced pressure at 40° C. and the coating liquid (200 g) was obtained. Then the film was formed in the same manner in Example 1. The dielectric constant of the coated film formed in the same manner was 2.2 and the modulus of elasticity was 6.3 GPa. The properties were measured after 30 days in the same manner as in Example 1, the identical values were obtained.

EXAMPLE 4

An aqueous 10 wt % bistetramethylammonium carbonate solution (45 g) and propylene glycol monopropyl ether (700 g) were added at 25° C. to the siloxane polymer solution (650 g) obtained in Synthetic Example 1. After stirring for one hour at 40° C., the reaction mixture was concentrated under reduced pressure at 40° C. and the coating liquid (700 g) was obtained. The film was then formed in the same manner as in Example 1. The dielectric constant of the coated film formed in the same manner was 2.4 and the modulus of elasticity was 8.7 GPa. The properties were measured after 30 days in the same manner as in Example 1, the exactly same values were obtained.

EXAMPLE 5

An aqueous 5 wt % tetramethylammonium p-toluenesulfonate solution (90 g) and propylene glycol monopropyl ether (700 g) were added at 25° C. to the siloxane polymer solution (650 g) obtained in Synthetic Example 1. After it was stirred for one hour, the reaction mixture was concentrated under reduced pressure at 40° C. and the coating liquid (700 g) was obtained. The film was then formed in the same manner as in Example 1. The dielectric constant of the coated film formed in the same manner was 2.5 and the modulus of elasticity was 7.0. GPa. The properties were measured after 30 days in the same manner in Example 1 and exactly same values were obtained.

EXAMPLE 6

An aqueous 5 wt % tetrabutylammonium acetate solution (16 g) and propylene glycol monopropyl ether (300 g) were added 25° C. to the solution (1 kg) obtained in Synthetic-Example 2. After it was stirred at 40° C. for one hour, the reaction mixture was concentrated under reduced pressure at 40° C. and the coating liquid (300 g) was obtained. The film was then formed in the same manner in Example 1. The dielectric constant of the coated film formed in the same manner was 2.1 and the modulus of elasticity was 5.1 GPa. The properties were measured after 30 days in the same manner in Example 1, the exactly same values were obtained.

EXAMPLE 7

An aqueous 10 wt % tetramethylammonium sulfate solution (13 g) and propylene glycol monopropyl ether (300 g) were added at 25° C. to the solution (1 kg) obtained in Synthetic Example 2. After it had been stirred for one hour, the reaction mixture was concentrated under reduced pressure at 40° C. and the coating liquid (300 g) was obtained. The film was then formed in the same manner as in Example 1. The dielectric constant of the coated film formed in the same manner was 2.2 and the modulus of elasticity was 5.8 GPa. The properties were measured after 30 days in the same manner as in Example 1 and the exactly same values were obtained.

EXAMPLE 8

An aqueous 5 wt % tributylmethylammonium formate solution (25 g) and propylene glycol monopropyl ether (200 g) were added at 25° C. to the solution (1 kg) obtained in Synthetic Example 3. After it was stirred for one hour, the reaction mixture was concentrated under reduced pressure at 40° C. and the coating liquid (400 g) was obtained. The film was then formed in the same manner as in Example 1. The dielectric constant of the coated film formed in the same manner was 2.0 and the modulus of elasticity was 4.3 GPa. The properties were measured after 30 days in the same manner as in Example 1, the exact same values were obtained.

EXAMPLE 9

An aqueous 10 wt % tetraethylammonium lactate solution and propylene glycol monopropyl ether (250 g) were added at 25° C. to the solution (1 kg) obtained in Synthetic Example 3. After it was stirred for one hour, the reaction mixture was concentrated under reduced pressure at 40° C. and the coating liquid (250 g) was obtained. The film was then formed in a similar way to that in Example 1. The dielectric constant of the coated film formed in the same manner was 2.4 and the modulus of elasticity was 5.3 GPa. The properties were measured after 30 days in the same manner in Example 1 and the exactly same values were obtained.

COMPARATIVE EXAMPLE 1

Experiment was carried out in the same manner as in In Example 1, except that the aqueous 5 wt % tetramethylammonium hydroxide solution (90 g) was added instead of the aqueous 5 wt % tetramethylammonium caproate solution. Then the coated film having dielectric constant of 2.4 and modulus of elasticity of 3.3 GPa was obtained. When the coating liquid was left stand at 23° C., it gelated in three days so that the coating application became impossible.

COMPARATIVE EXAMPLE 2

The experiment was carried in the same manner in Example 2 except that an aqueous 5 wt % trimethyloctylammonium hydroxide solution (16 g) was added instead of the aqueous 5 wt % trimethyloctylammonium acetate solution in Example 2. Then, coated film having dielectric constand of 2.3 and modulus of elasticity of 1.9 GPa was obtained. When the coating liquid was left stand at 23° C., it gelated in three days so that the coating application became impossible.

COMPARATIVE EXAMPLE 3

The experiment was carried in the same manner in Example 3 except an aqueous 5 wt % tetrapropylammonium bromide (16 g) was added instead of the aqueous 5 wt % tetrapropylammonium acetate solution. Then, coated film having dielectric constant of 2.4 and modulus of elasticity of 1.8 GPa was obtained. The 50 ppm bromine was detected in the film so that corrosion of the wiring material was possible. Therefore, it became evident that it was useless for actual semiconductor device manufacturing.

The results are summarized in Table 1.

TABLE 1

| | siloxane polymer | quaternary ammonium salt | dielectric constant | modulus (GPa) | remark |
|---|---|---|---|---|---|
| Example 1 | Syn. Ex. 1 | $(CH_3)_4N^+(C_5H_{11}COO)^-$ | 2.2 | 6.5 | no property change after 30 days |
| Example 2 | Syn. Ex. 2 | $[(CH_3)_3(C_8H_{17})N]^+(CH_3COO)^-$ | 2.1 | 5.5 | no property change after 30 days |
| Example 3 | Syn. Ex. 3 | $(C_3H_7)_4N^+(CH_3COO)^-$ | 2.2 | 6.3 | no property change after 30 days |
| Example 4 | Syn. Ex. 1 | $[(CH_3)_4N^+]_2(CO_3)^{2-}$ | 2.4 | 8.7 | no property change after 30 days |

TABLE 1-continued

| | siloxane polymer | quaternary ammonium salt | dielectric constant | modulus (GPa) | remark |
|---|---|---|---|---|---|
| Example 5 | Syn. Ex. 1 | $(CH_3)_4N^+(p\text{-}CH_3\text{-}ph\text{-}SO_3)^-$ | 2.5 | 7.0 | no property change after 30 days |
| Example 6 | Syn. Ex. 2 | $(C_4H_9)_4N^+(CH_3COO)^-$ | 2.1 | 5.1 | no property change after 30 days |
| Example 7 | Syn. Ex. 2 | $[(CH_3)_4N^+]_2(SO_4)^{2-}$ | 2.2 | 5.8 | no property change after 30 days |
| Example 8 | Syn. Ex. 3 | $[(C_4H_9)_3(CH_3)N]^+(HCOO)^-$ | 2.0 | 4.3 | no property change after 30 days |
| Example 9 | Syn. Ex. 3 | $(C_2H_5)_4N^+[CH_3CH(OH)COO]^-$ | 2.4 | 5.3 | no property change after 30 days |
| Comp. Ex. 1 | Syn. Ex. 1 | $(CH_3)_4N^+(OH)^-$ | 2.4 | 3.3 | gelation after 3 days |
| Comp. Ex. 2 | Syn. Ex. 2 | $[(CH_3)_3(C_8H_{17})N]^+(OH)^-$ | 2.3 | 1.9 | gelation after 5 days |
| Comp. Ex. 3 | Syn. Ex. 3 | $(C_3H_7)_4N^+(Br)^-$ | 2.4 | 1.8 | bromine porion 50 ppm |

The invention claimed is:

1. A composition for forming porous film, the composition consisting essentially of siloxane polymer and one or more quaternary ammonium salts represented by following formula (1) or (2):

  (1)

  (2)

wherein $R^1$ independently represents a straight chain or branched alkyl or aryl group having 1 to 10 carbons which may have a substituent and $R^1$s may be same or different; $R^2$ represents a hydrogen atom or an straight chain or branched alkyl or aryl group having 1 to 10 carbons which may have a substituent; X represents $CO_2$, $OSO_3$, or $SO_3$; Y represents $SO_4$, $SO_3$, $CO_3$, $O_2C\text{—}CO_2$, $NO_3$, or $NO_2$; and k is 0 or 1, m is 1 or 2 and n is 1 or 2 in proviso that n=1 requires k=0 and m=1, and n=2 requires k=0 and m=2, or k=1 and m=1, and wherein the one or more quaternary ammonium salts are present in an amount of 0.001 to 10 parts by weight per one part by weight of the siloxane polymer.

2. Re composition for forming porous film according to claim 1 wherein said siloxane polymer has a weight-average molecular weight of 10,000 to 1,000,000 using polyethylene as a standard.

3. A method for tinning porous film comprising steps of applying said composition of claim 1 on a substrate to form a film and heating the film.

* * * * *

UNITED STATES PATENT AND TRADEMARK OFFICE
CERTIFICATE OF CORRECTION

| | |
|---|---|
| PATENT NO. | : 7,132,473 B2 |
| APPLICATION NO. | : 10/706862 |
| DATED | : November 7, 2006 |
| INVENTOR(S) | : Ogihara et al. |

It is certified that error appears in the above-identified patent and that said Letters Patent is hereby corrected as shown below:

Column 18,
Line 31, Claim 3 "tinning" should read --forming--.

Signed and Sealed this

Twentieth Day of March, 2007

JON W. DUDAS
*Director of the United States Patent and Trademark Office*